United States Patent
Dezelah et al.

(10) Patent No.: US 12,104,244 B2
(45) Date of Patent: *Oct. 1, 2024

(54) METHODS AND SYSTEMS FOR FILLING A GAP

(71) Applicant: ASM IP Holding B.V., Almere (NL)

(72) Inventors: Charles Dezelah, Helsinki (FI); Timothee Blanquart, Oud-Heverlee (BE); René Henricus Jozef Vervuurt, Leuven (BE); Viljami Pore, Helsinki (FI)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/953,769

(22) Filed: Sep. 27, 2022

(65) Prior Publication Data
US 2023/0098575 A1    Mar. 30, 2023

Related U.S. Application Data
(60) Provisional application No. 63/250,773, filed on Sep. 30, 2021.

(51) Int. Cl.
| C23C 16/04 | (2006.01) |
| C23C 16/08 | (2006.01) |
| C23C 16/513 | (2006.01) |
| C23C 16/56 | (2006.01) |
| H01L 21/285 | (2006.01) |

(52) U.S. Cl.
CPC ............ *C23C 16/045* (2013.01); *C23C 16/08* (2013.01); *C23C 16/513* (2013.01); *C23C 16/56* (2013.01); *H01L 21/28556* (2013.01)

(58) Field of Classification Search
None
See application file for complete search history.

(56) References Cited

U.S. PATENT DOCUMENTS
| 6,623,799 B1 | 9/2003 | Lee et al. |
| 6,720,262 B2 | 4/2004 | Koh et al. |
| 2022/0285211 A1 * | 9/2022 | Färm ................. H01L 21/28562 |

OTHER PUBLICATIONS
Antti Niskanen, et al., "Radical-Enhanced Atomic Layer Deposition of Metallic Copper Thin Films," Journal of The Electrochemical Society, 152 (1) G25-G28 (2005).
Hyunsang Park, et al., "Superfilling CVD of Copper Using A Catalytic Surfactant," 2001 IEEE, 3pp.

* cited by examiner

*Primary Examiner* — Jose I Hernandez-Kenney
(74) *Attorney, Agent, or Firm* — Snell & Wilmer L.L.P.

(57) ABSTRACT

Disclosed are methods and systems for filling a gap. An exemplary method comprises providing a substrate to a reaction chamber. The substrate comprises the gap. The method further comprises forming a convertible layer on the substrate and exposing the substrate to a conversion reactant. Accordingly, at least a part of the convertible layer is converted into a gap filling fluid. The gap filling fluid at least partially fills the gap. The methods and systems are useful, for example, in the field of integrated circuit manufacture.

19 Claims, 6 Drawing Sheets

METHODS AND SYSTEMS FOR FILLING A GAP

CROSS-REFERENCE TO RELATED APPLICATIONS

This application claims priority to U.S. Provisional Patent Application Ser. No. 63/250,773, filed Sep. 30, 2021, and titled METHODS AND SYSTEMS FOR FILLING A GAP, the disclosure of which is hereby incorporated by reference in its entirety.

FIELD OF INVENTION

The present disclosure generally relates to the field of semiconductor processing methods and systems, and to the field integrated circuit manufacture. In particular, methods and systems suitable for filling a gap are disclosed.

BACKGROUND OF THE DISCLOSURE

The scaling of semiconductor devices, such as, for example, logic devices and memory devices, has led to significant improvements in speed and density of integrated circuits. However, conventional device scaling techniques face significant challenges for future technology nodes.

For example, one challenge has been finding suitable ways of filling gaps such as recesses, trenches, vias and the like with a material without formation of any gaps or voids.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of filling a gap, to structures and devices formed using such methods, and to apparatus for performing the methods and/or for forming the structures and/or devices. The layers may be used in a variety of applications. For example, they may be used in the field of integrated circuit manufacture.

Thus described herein is a method of filling a gap. The method comprises providing a substrate to a reaction chamber. The substrate comprises the gap. The method further comprises forming a convertible layer on the substrate. The method further comprises exposing the substrate to a conversion reactant. Thereby at least a part of the convertible layer is converted into a gap filling fluid. Accordingly, the gap filling fluid at least partially fills the gap.

In some embodiments, the convertible layer comprises at least one of a metal, a metal oxide, a metal nitride, and a metal carbide.

In some embodiments, the convertible layer is at least partially metallic or semiconducting.

Further described herein is a system. The system comprises a reaction chamber. The system further comprises a precursor gas source. The precursor gas source comprises a metal precursor. The system further comprises a deposition reactant gas source. The deposition reactant gas source comprises a deposition reactant. The system further comprises a controller. The controller is configured to control gas flow into the reaction chamber to form a layer on a substrate by means of a method as described herein.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
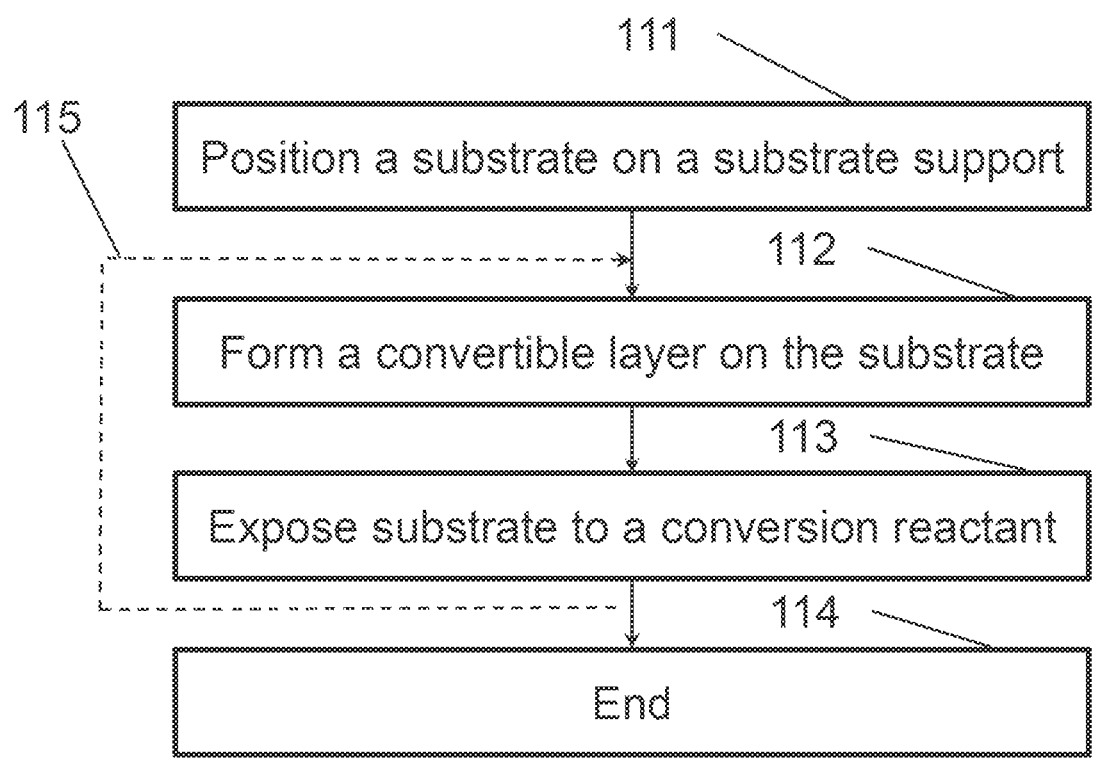
FIG. 1 illustrates an embodiment of a method as disclosed herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include at least one of bulk semiconductor material and an insulating or dielectric material layer overlying at least a portion of the bulk semiconductor material.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may partially or wholly consist of a plurality of dispersed atoms on a surface of a substrate and/or embedded in a substrate/ and/or embedded in a device manufactured on that substrate. A film or layer may comprise material or a layer with pinholes and/or isolated islands. A film or layer may be at least partially continuous. A film or layer may be patterned, e.g. subdivided, and may be comprised in a plurality of semiconductor devices.

As used herein, a "structure" can be or can include a substrate as described herein. Structures can include one or more layers overlying the substrate, such as one or more layers formed according to a method as described herein. Device portions can be or include structures.

The term "deposition process" as used herein can refer to the introduction of precursors (and/or reactants) into a reaction chamber to deposit a layer over a substrate. "Cyclical deposition processes" are examples of "deposition processes".

As used herein, the term "gap filling fluid", also referred to as "flowable gap fill", may refer to a composition of matter that is liquid, or that can form a liquid, under the conditions under which is formed and which has the capability to form a solid material in a gap. A "gap filling fluid" can, in some embodiments, be only temporarily in a flowable state, for example when the "gap filling fluid" is temporarily formed through formation of liquid oligomers from gaseous monomers during a polymerization reaction, and the liquid oligomers continue to polymerize to form a solid polymeric material; or when the gap filling fluid solidifies after cooling down; or when the gap filling fluid forms a solid material as it undergoes a chemical reaction. For ease of reference, a solid material formed from a gap filling fluid may, in some embodiments, be simply referred to as "gap filling fluid".

A method as described herein can comprise depositing a layer by means of a cyclic deposition process. The term "cyclic deposition process" or "cyclical deposition process" can refer to a sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a CVD component.

A method as described herein can comprise depositing a layer by means of an atomic layer deposition process. The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, the term "purge" may refer to a procedure in which an inert or substantially inert gas is provided to a reaction chamber in between two pulses of gasses that react with each other. For example, a purge, e.g. using a noble gas, may be provided between a precursor pulse and a reactant pulse, thus avoiding or at least minimizing gas phase interactions between the precursor and the reactant. It shall be understood that a purge can be effected either in time or in space, or both. For example in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

As used herein, a "precursor" includes a gas or a material that can become gaseous and that can be represented by a chemical formula that includes an element that may be incorporated during a deposition process as described herein.

The term "reactant" can refer to a gas or a material that can become gaseous and that can react with a precursor.

Further, in this disclosure, any two numbers of a variable can constitute a workable range of the variable, and any ranges indicated may include or exclude the endpoints. Additionally, any values of variables indicated may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments.

In this disclosure, any defined meanings do not necessarily exclude ordinary and customary meanings, in some embodiments.

Described herein is a method of filling a gap. The method comprises providing a substrate that comprises a gap to a reaction chamber. A monocrystalline silicon wafer may be a suitable substrate. Other substrates may be suitable well, e.g. monocrystalline germanium wafers, gallium arsenide wafers, quartz, sapphire, glass, steel, aluminum, silicon-on-insulator substrates, plastics, etc.

The method further comprises forming a convertible layer on the substrate, and then exposing the substrate to a conversion reactant. Accordingly, at least part of the convertible layer is converted into a gap filling fluid that at least partially fills the gap.

The presently disclosed method allow formation of a metal and halogen containing gap filling fluid.

In some embodiments, the metal and halogen containing gap filling fluid comprises oligomers that undergo chain growth as gaseous precursor polymerizes. Accordingly, a flowable oligomer-containing gap filling fluid can, in some embodiments, be temporarily formed on the substrate's surface that solidifies as the oligomers undergo chain growth. Thus, a flowable gap filling fluid can be obtained even at temperatures that are lower than the bulk melting point of a converted layer that is formed by means of a method as disclosed herein. Of course, the presently described methods can also be used at conversion temperatures which exceed the melting point of the converted layers formed by means of the presently described methods. In such cases, the gap filling fluid can, in some embodiments, be solidified by cooling the substrate down.

In some embodiments, the gap filling fluid is formed wherever a convertible layer is present on the substrate. When the substrate has a surface that is completely covered by the convertible layer, a gap filling fluid can be formed over the entire substrate surface, both outside gaps and inside gaps comprised in the substrate. When the substrate has a surface that is only partially covered by the convertible layer, then the gap filling fluid can be preferentially formed only in those places where the convertible layer is present. When the gap filling fluid is formed both outside of the gaps and inside the gaps, the gap filling fluid can, in some exemplary modes of operation, be drawn into a gap by at least one of capillary forces, surface tension, and gravity. It shall be understood that a distal portion of the gap feature refers to a portion of the gap feature that is relatively far removed from a substrate's surface, and that the proximal portion of a gap feature refers to a part of the gap feature that is closer to the substrate's surface compared to the lower/deeper portion of the gap feature.

The materials formed according to the present methods can be advantageously used in the field of integrated circuit manufacture.

Exemplary gaps include recesses, contact holes, vias, trenches, and the like. In some embodiments, the gap has a depth of at least 5 nm to at most 500 nm, or of at least 10 nm to at most 250 nm, or from at least 20 nm to at most 200 nm, or from at least 50 nm to at most 150 nm, or from at least 100 nm to at most 150 nm.

In some embodiments, the gap has a width of at least 10 nm to at most 10 000 nm, or of at least 20 nm to at most 5 000 nm, or from at least 40 nm to at most 2 500 nm, or from at least 80 nm to at most 1000 nm, or from at least 100 nm to at most 500 nm, or from at least 150 nm to at most 400 nm, or from at least 200 nm to at most 300 nm.

In some embodiments, the gap has a length of at least 10 nm to at most 10 000 nm, or of at least 20 nm to at most 5 000 nm, or from at least 40 nm to at most 2 500 nm, or from at least 80 nm to at most 1000 nm, or from at least 100 nm to at most 500 nm, or from at least 150 nm to at most 400 nm, or from at least 200 nm to at most 300 nm.

The convertible layer can suitably be deposited using a deposition technique that yields conformal layers, such as atomic layer deposition (ALD) or another cyclical deposition process. Alternatively, the convertible layer can be deposited using a deposition technique that yields non-conformal layers, i.e. non-uniform layers, such as layers that have a higher thickness on a flat surface of a substrate, than inside a gap or trench; or layers that have a higher thickness inside a gap or trench than on a flat surface of a substrate. Examples of techniques that can yield non-conformal layers are chemical vapor deposition and plasma-enhanced chemical vapor deposition.

Depositing the convertible layer may comprise executing a cyclical deposition process. The cyclical deposition process can include cyclical CVD, ALD, or a hybrid cyclical CVD/ALD process. For example, in some embodiments, the growth rate of a particular ALD process may be low compared to a CVD process. One approach to increase the growth rate may be that of operating at a higher deposition temperature than that typically employed in an ALD process, resulting in some portion of a chemical vapor deposition process, i.e. of at least one of non-self-limiting surface and gas phase reactions, but still taking advantage of the sequential introduction of reactants. Such a process may be referred to as cyclical CVD. In some embodiments, a cyclical CVD process may comprise the introduction of two or more precursors or reactants into the reaction chamber, wherein there may be a time period of overlap between the two or more precursors or reactants in the reaction chamber resulting in both an ALD component of the deposition and a CVD component of the deposition. This is referred to as a hybrid process. In accordance with further examples, a cyclical deposition process may comprise a continuous flow of one reactant or precursor and periodic pulsing of a second reactant or precursor into the reaction chamber.

In some embodiments, the convertible layer is conformally deposited on the substrate. In other words, the convertible layer can have a thickness which is constant over the surface of the substrate, including in gaps, recesses, and the like, e.g. within a margin of error of 50%, 20%, 10%, 5%, 2%, 1%, 0.5%, or 0.1%.

In some embodiments, the convertible layer is deposited by means of a deposition method that yields a growth rate at a distal surface of a gap that is higher than a growth rate at a proximal surface of the gap. In some embodiments, the growth rate at the distal surface of the gap is from at least 200% to at most 500, or from at least 100% to at most 200%, or from at least 50% to at most 100%, or from at least 20% to at most 50%, or from at least 10% to at most 20%, or from at least 5% to at most 10%, or from at least 2% to at most 5%, or from at least 1% to at most 2% higher than the growth rate at the proximal surface of the gap.

Suitable convertible layers include layers that comprise at least one of a metal, a metal oxide, a metal nitride, and a metal carbide. For example, the convertible layer can comprise an element selected from tungsten (W), germanium (Ge), antimony (Sb), tellurium (Te), niobium (Nb), tantalum (Ta), vanadium (V), titanium (Ti), zirconium (Zr), rhodium (Rh), iron (Fe), chromium (Cr), molybdenum (Mo), gold (Au), platinum (Pt), silver (Ag), nickel (Ni), copper (Cu), cobalt (Co), zinc (Zn), aluminum (Al), indium (In), tin (Sn), hafnium (Hf), ruthernium (Ru), and bismuth (Bi).

In some embodiments, the convertible layer is at least partially metallic. In some embodiments, the convertible layer comprises a metal alloy. Thus, and in some embodiments, the convertible layer comprises an elemental metal, e.g. an elemental metal having an impurity content of less than 10 atomic percent, of less than 5 atomic percent, of less than 2 atomic percent, or less than 1 atomic percent.

Additionally or alternatively, the convertible layer can be at least partially semiconducting.

Additionally or alternatively, the convertible layer can be at least partially dielectric.

In some embodiments, the convertible layer comprises a metal oxide.

In some embodiments, the convertible layer comprises a metal nitride.

In accordance with some examples of the disclosure, forming the convertible layer comprises a thermal deposition process. In these cases, the deposition process does not include generating a plasma to form activated species for use in the deposition process.

In some embodiments, the conversion reactant comprises a halogen. Suitable halogen-containing conversion reactants include elemental halogens and hydrogen halides. For example, the conversion reactant can comprise an elemental halogen selected from $F_2$, $Cl_2$, $Br_2$, and $I_2$. Additionally or alternatively, the conversion reactant can comprise a hydrogen halide selected from HF, HCl, HBr, and HI.

In some embodiments, the conversion reactant comprises a bond selected from a C—Cl bond, a P—Cl bond, a N—Cl bond, and a S—Cl bond.

In some embodiments, the conversion reactant comprises a compound having a chemical formula according to formula (i).

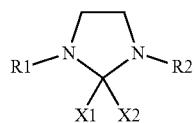

(i)

It shall be understood that R1 and R2 are independently selected from H and hydrocarbyl. In some embodiments, R1 and R2 are identical. In some embodiments, $R^1$ and $R^2$ differ. In some embodiments, at least one of R1 and R2 is selected from methyl, ethyl, propyl, butyl, and pentyl. In some embodiments, at least one of R1 and R2 is a C1 to C6 alkyl. In some embodiments, at least one of R1 and R2 is an aryl. In some embodiments, at least one of R1 and $R^2$ is a C1 to C6 alkenyl.

It shall be understood that the expression C1 to C6 alkyl refers to an alkyl group having 1 to 6 carbon atoms. Similarly, it shall be understood that the expression C1 to C6 alkenyl refers to an alkenyl group having 1 to 6 carbon atoms.

It shall be understood that X1 and X2 are independently selected from F, Cl, Br, and I. In some embodiments, X1 and X2 are identical. In some embodiments, X1 and X2 differ. In some embodiments, at least one of X1 and X2 are selected from F, Cl, Br, and I.

In some embodiments R1 and R2 are methyl, and X1 and X2 are F. Such a compound is advantageously a volatile liquid at room temperature, it is simple to synthesize, and it is stable up to 150° C. It can fluorinate hydroxyl and carbonyl groups with formation of volatile by-products.

In some embodiments, the conversion reactant comprises a compound having a chemical formula according to formula (ii):

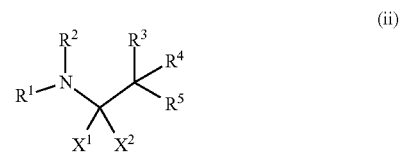

(ii)

It shall be understood that R1 and R2 can be independently selected from H and hydrocarbyl. In some embodiments, R1 and R2 are independently selected from H, methyl, ethyl, propyl, butyl, and pentyl. In some embodiments, R1 and R2 are independently selected from a C1 to C6 alkyl. In some embodiments, R1 and R2 are aryl. In some embodiments, R1 and R2 are independently selected from C1 to C6 alkenyl. In some embodiments, R1 and R2 are identical. In some embodiments, R1 and R2 are different.

It shall be understood that at least one of X1 and X2 is a halogen. In some embodiments, X1 is a halogen such as F, Cl, Br, or I, and X2 is hydrogen. In some embodiments, X2 is a halogen such as F, Cl, Br, or I, and X1 is hydrogen. In some embodiments, X1 and X2 are halogens. In some embodiments, X1 and X2 are identical. In some embodiments, X1 and X2 differ. In some embodiments, X1 and X2 are independently selected from F, Cl, Br, and I.

It shall be understood that R3, R4, and R5 are independently selected from: H, a C1-C6 alkyl group, a halogenated C1-C6 alkyl group. In some embodiments, R3, R4, and R5 are independently selected from F, Cl, Br, and I. In some embodiments, R3, R4, and R5 are identical. In some embodiments, at least two of R3, R4, and R5 differ. In some embodiments, R3, R4, and R5 are F. In some embodiments, R3, R4, and R5 are Cl. In some embodiments, R3, R4, and R5 are Br. In some embodiments, R3, R4, and R5 are I.

In some embodiments R1 and R2 are ethyl, and X1, X2, R3, R4, and R5 are F. Such a compound advantageously has a sizable vapor pressure, i.e. ca. 10 Torr at 20° C. It can readily and selectively fluorinate hydroxyl and carboxylic acid groups, while leaving aldehydes and ketones unaffected.

In some embodiments, the conversion reactant comprises a compound that has a structure according to formula (iii)

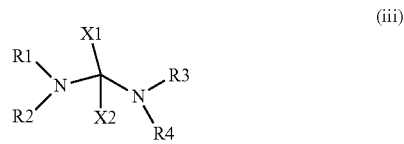

(iii)

It shall be understood that R1, R2, R3, and R4 can be independently selected from H and hydrocarbyl. In some embodiments, R1, R2, R3, and R4 are independently selected from H, methyl, ethyl, propyl, butyl, and pentyl. In some embodiments, R1, R2, R3, and R4 are independently selected from a C1 to C6 alkyl. In some embodiments, at least one of R1, R2, R3, and R4 is an aryl. In some embodiments, R1, R2, R3, and R4 are independently selected from C1 to C6 alkenyl. In some embodiments, R1, R2, R3, and R4 are identical. In some embodiments, R1, R2, R3, and R4 are different.

It shall be understood that at least one of X1 and X2 is a halogen. In some embodiments, X1 is a halogen such as F, Cl, Br, or I, and X2 is hydrogen. In some embodiments, X2 is a halogen such as F, Cl, Br, or I, and X1 is hydrogen. In some embodiments, X1 and X2 are halogens. In some embodiments, X1 and X2 are identical. In some embodiments, X1 and X2 differ. In some embodiments, X1 and X2 are independently selected from F, Cl, Br, and I.

In some embodiments, the conversion reactant comprises a compound that has a structure according to formula (iv)

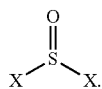

(iv)

It shall be understood that X is selected from F, Cl, Br, and I. In some embodiments, X is Cl. In some embodiments, X is F or Cl.

In some embodiments, the conversion reactant comprises a compound that has a structure according to formula (v)

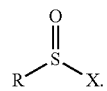

(v)

It shall be understood that X is selected from F, Cl, Br, and I. In some embodiments, X is Cl. In some embodiments, X is F or Cl. It shall be understood that R is a hydrocarbyl. In some embodiments, R is a C1 to C6 alkyl. In some embodiments, R is selected from methyl, ethyl, propyl, butyl, and pentyl. In some embodiments, R is an aryl. In some embodiments, R is a C1 to C6 alkenyl.

In some embodiments, the conversion reactant comprises a compound that has a structure according to formula (vi)

(vi)

It shall be understood that X is selected from F, Cl, Br, and I. In some embodiments, X is Cl. In some embodiments, X is F or Cl.

In some embodiments, the conversion reactant comprises a compound that has a structure according to formula (vii)

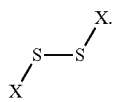

(vii)

It shall be understood that X is selected from F, Cl, Br, and I. In some embodiments, X is Cl. In some embodiments, X is F or Cl.

In some embodiments, the conversion reactant comprises a compound that has a structure according to formula (viii)

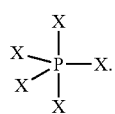

(viii)

It shall be understood that X is selected from F, Cl, Br, and I. In some embodiments, X is Cl.

In some embodiments, the conversion reactant comprises a compound that has a structure according to formula (ix)

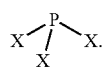

(ix)

It shall be understood that X is selected from F, Cl, Br, and I. In some embodiments, X is Cl.

In some embodiments, the conversion reactant comprises a compound that has a structure according to formula (x)

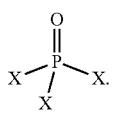

(x)

It shall be understood that X is selected from F, Cl, Br, and I. In some embodiments, X is Cl.

In some embodiments, the conversion reactant comprises a compound that has a structure according to formula (xi)

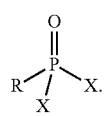

(xi)

It shall be understood that X is selected from F, Cl, Br, and I. In some embodiments, X is Cl. It shall be understood that R is a hydrocarbyl. In some embodiments, R is a C1 to C6 alkyl. In some embodiments, R is selected from methyl, ethyl, propyl, butyl, and pentyl. In some embodiments, R is an aryl. In some embodiments, R is a C1 to C6 alkenyl.

In some embodiments, the conversion reactant comprises a compound that has a structure according to formula (xii)

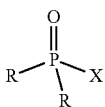

(xii)

It shall be understood that X is selected from F, Cl, Br, and I. In some embodiments, X is Cl. It shall be understood that R is a hydrocarbyl. In some embodiments, R is a C1 to C6 alkyl. In some embodiments, R is selected from methyl, ethyl, propyl, butyl, and pentyl. In some embodiments, R is an aryl. In some embodiments, R is a C1 to C6 alkenyl.

In some embodiments, the conversion reactant comprises an acyl halide, such as an acyl chloride.

In some embodiments, the acyl halide comprises a compound having a structure according to formula (xiii)

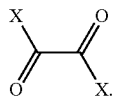

(xiii)

It shall be understood that X is selected from F, Cl, Br, and I. In some embodiments, X is Cl.

In some embodiments, the acyl halide comprises a compound having a structure according to formula (xiv)

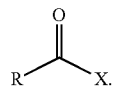

(xiv)

It shall be understood that X is selected from F, Cl, Br, and I. In some embodiments, X is Cl. It shall be understood that R is a hydrocarbyl. In some embodiments, R is a C1 to C6 alkyl. In some embodiments, R is selected from methyl, ethyl, propyl, butyl, and pentyl. In some embodiments, R is an aryl. In some embodiments, R is a C1 to C6 alkenyl.

In some embodiments, the conversion reactant has a structure according to formula (xv)

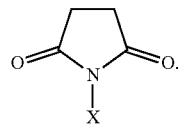

(xv)

It shall be understood that X is selected from F, Cl, Br, and I. In some embodiments, X is Cl. In some embodiments, the conversion reactant comprises N-Chlorosuccinimide.

In some embodiments, the conversion reactant comprises a compound having a structure according to formula (xvi)

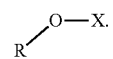

(xvi)

It shall be understood that X is selected from F, Cl, Br, and I. In some embodiments, X is Cl. It shall be understood that R is a hydrocarbyl. In some embodiments, R is a C1 to C6 alkyl. In some embodiments, R is selected from methyl, ethyl, propyl, butyl, and pentyl. In some embodiments, R is an aryl. In some embodiments, R is a C1 to C6 alkenyl. In some embodiments, R is tert-butyl.

In some embodiments, the conversion reactant comprises a compound having a structure according to formula (xvii)

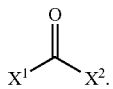

(xvii)

It shall be understood that X1 and X2 are independently selected from F, Cl, Br, and I. In some embodiments X1 equals X2. In some embodiments, X1 and X2 are different. In some embodiments, at least one of X1 and X2 is F. In some embodiments, at least one of X1 and X2 is Cl. In some embodiments, at least one of X1 and X2 is Br. In some embodiments, at least 1 of X1 and X2 is I. Thus, some embodiments, the conversion reactant comprises a thionyl halide. In some embodiments, the thionyl halide comprises a thionyl bromide. In some embodiments, the thionyl halide comprises a thionyl iodide.

In some embodiments, the conversion reactant comprises iodine (I). Thus, an iodine-containing gap filling fluid can be formed. The gap filling fluid can, in some embodiments, comprise one of a metal iodide or a metal oxy-iodide.

In some embodiments, the conversion reactant comprises an alkyl iodide, such as a C1 to C6 iodinated alkyl. In some embodiments, the alkyl iodide comprises two iodine atoms. In some embodiments, the two iodine atoms are connected to the same carbon atom. In some embodiments, the two iodine atoms are connected to adjacent carbon atoms. Exemplary alkyl iodides include 1,1-diiodoalkanes such as 1,1-diiodoethane, and 1,2-diiodoalkanes such as 1,2-diiodoethane.

In some embodiments, the conversion reactant comprises an aryl iodide, such as an aryl comprising one, two, three, four, five, or six iodine atoms. In some embodiments, the aryl iodide comprises one iodine atom. An exemplary aryl iodide includes iodobenzene.

In some embodiments, the conversion reactant comprises (Br). Thus, a bromine-containing gap filling fluid can be formed. The gap filling fluid can, in some embodiments, comprise one of a metal bromide and a metal oxybromide.

In some embodiments, the conversion reactant comprises an alkyl bromide, such as a C1 to C6 brominated alkyl. In some embodiments, the alkyl bromide comprises two bromine atoms. In some embodiments, the two bromine atoms are connected to the same carbon atom. In some embodiments, the two bromine atoms are connected to adjacent carbon atoms. Exemplary alkyl bromides include 1,1-dibromoalkanes such as 1,1-dibromoethane, and 1,2-dibromoalkanes such as 1,2-dibromoethane.

In some embodiments, the conversion reactant comprises an aryl bromide, such as an aryl comprising one, two, three, four, five, or six iodine atoms. In some embodiments, the aryl bromide comprises one bromine atom. An exemplary aryl bromine includes bromobenzene.

In some embodiments, the conversion reactant comprises a dihalogen molecule. Suitable dihalogen molecules include dihalogen molecules consisting of two identical halogen atoms and dihalogen molecules consisting of two different halogen atoms. Exemplary dihalogens include $Br_2$, $I_2$, Cl—Br, Cl—I, and Br—I.

In some embodiments, the conversion reactant comprises a hydrogen halide. Suitable hydrogen halides include HCl and HBr.

In some embodiments, the conversion reactant comprises an acyl halide. Suitable acyl halides include acyl bromides and acyl iodides. A suitable acyl bromide includes oxalyl bromide. A suitable acyl halide includes oxalyl iodide.

In some embodiments, the conversion reactant comprises a halosilane. Suitable halosilanes can comprise one or more silicon atoms and one or more halogen atoms. Suitable halosilanes can comprise hydrogen. In some embodiments, the halosilane is a bromosilane. In some embodiments, the halosilane is a iodosilane. Suitable bromosilanes include $SiBr_4$ and $SiH_2Br_2$. Suitable iodosilanes include $SiI_4$ and $SiH_2I_2$.

In some embodiments, the conversion reactant comprises a metal halide, such as a transition metal halide, or a post transition metal halide, or a rare earth metal halide. Suitable metal halides include $SnBr_4$, $SnI_4$, $AlBr_3$, $AlI_3$, $TiBr_4$, and $TiI_4$.

In some embodiments, the conversion reactant comprises a phosphorous-halogen bond, for example one or more of a P—Br bond and a P—I bond. Exemplary conversion reactants include $PBr_3$, $PBr_5$, $POBr_3$, and $POI_3$.

In some embodiments, the conversion reactant comprises a nitrogen-halogen bond, for example one or more of a N—Br bond and a N—I bond. Exemplary conversion reactants include N-bromosuccinimide and N-iodosuccinimide.

In some embodiments, the conversion reactant comprises an alkyl hypohalide such as an alkyl hypobromite or an alkyl hypoiodite. Exemplary conversion reactants include tert-butyl hypbromite.

In some embodiments, the conversion reactant comprises a halogen salt, such as a volatile halogen salt, such as a volatile boron or iodine-containing salt. Exemplary conversion reactants include ammonium halides such as ammonium bromide and ammonium iodide. Further exemplary conversion reactants include pyridinium halides such as pyridinium bromide, pyridinium perbromide, and pyridinium iodide.

In some embodiments, the substrate is maintained at a temperature of at least −25° C. to at most 400° C., or at a temperature of at least 0° C. to at most 200° C., or at a temperature of at least 25° C. to at most 150° C., or at a temperature of at least 50° C. to at most 100° C. while exposing the substrate to the active species.

In some embodiments, the convertible layer is deposited at a substrate temperature of less than 800° C., or of at least 50° C. to at most 500° C., or of at least 100° C. to at most 300° C. In some embodiments, the convertible layer is deposited at a temperature of at least −25° C. to at most 300° C., or at a temperature of at least 0° C. to at most 250° C., or at a temperature of at least 25° C. to at most 200° C., or at a temperature of at least 50° C. to at most 150° C., or at a temperature of at least 75° C. to at most 125° C.

In some embodiments, and while the substrate is exposed to a conversion reactant, the substrate is maintained at a temperature of less than 800° C., or of at least −25° C. to at most 800° C., or of at least 0° C. to at most 700° C., or of at least 25° C. to at most 600° C., or of at least 50° C. to at most 400° C., or of at least 75° C. to at most 200° C., or of at least 100° C. to at most 150° C.

In some embodiments, and while the gap filling fluid is transformed into a transformed material, the substrate is maintained at a temperature of less than 800° C., or of at least −25° C. to at most 800° C., or of at least 0° C. to at most 700° C., or of at least 25° C. to at most 600° C., or of at least 50° C. to at most 400° C., or of at least 75° C. to at most 200° C., or of at least 100° C. to at most 150° C. In some embodiments, the temperature at which the substrate is maintained while the substrate is exposed to a conversion reactant equals the temperature at which the substrate is maintained while the gap filling fluid is transformed into a transformed material.

In some embodiments, the presently described methods are carried out at a pressure of less than 760 Torr or of at least 0.2 Torr to at most 760 Torr, of at least 1 Torr to at most 100 Torr, or of at least 1 Torr to at most 10 Torr. In some embodiments, the convertible layer is deposited at a pressure of at mot 10.0 Torr, or at a pressure of at most 5.0 Torr, or at a pressure of at most 3.0 Torr, or at a pressure of at most 2.0 Torr, or at a pressure of at most 1.0 Torr, or at a pressure of at most 0.1 Torr, or at a pressure of at most $10^{-2}$ Torr, or at a pressure of at most $10^{-3}$ Torr, or at a pressure of at most $10^{-4}$ Torr, or at a pressure of at most $10^{-5}$ Torr, or at a pressure of at least 0.1 Torr to at most 10 Torr, or at a pressure of at least 0.2 Torr to at most 5 Torr, or at a pressure of at least 0.5 Torr to at most 2.0 Torr.

In some embodiments, the substrate is exposed to the conversion reactant for a duration of at least 0.1 s to at most 1000 s, or of at least 0.2 s to at most 500 s, or of at least 0.5 s to at most 200 s, or of at least 1.0 s to at most 100 s, or of at least 2 s to at most 50 s, or of at least 5 s to at most 20 s.

In some embodiments, the method further comprises a step of curing the gap filling fluid. In some embodiments, curing can be performed after all of the gap filling fluid has been deposited. Alternatively, curing can be done cyclically. For example, a method as described herein can comprise a curing step after each step of exposing the substrate to a conversion reactant. Alternatively, a method as described herein can comprise a curing step after every other step of exposing the substrate to a conversion reactant. Alternatively, a method as described herein can comprise a curing step after from at least 1% to at most 2%, or from at least 2% to at most 5%, or from at least 5% to at most 10%, or from at least 10% to at most 20%, or from at least 20% to at most 50%, or from at least 50% to at most 100 of the steps of exposing the substrate to a conversion reactant.

A curing step suitably comprises subjecting the substrate to a form of energy, e.g. at least one of heat energy, radiation, and particles. Exemplary curing steps comprise exposing the substrate to UV radiation. Additionally or alternatively, a curing step can comprise exposing the substrate to a direct plasma, e.g. a noble gas plasma such as an argon plasma. Additionally or alternatively, a curing step can comprise exposing the substrate to one or more reactive species such as ions and/or radicals generated in a remote plasma, e.g. a remote noble gas plasma, such as a remote argon plasma. Additionally or alternatively, a curing step can comprise exposing the substrate to photons, e.g. at least one of UV photons, photons in the visible spectrum, IR photons, and photons in the microwave spectrum. Additionally or alternatively, a curing step can comprise heating the substrate.

In some embodiments, the convertible layer comprises an element selected from Ge, Sb, and Te.

Suitably, when the convertible layer comprises Ge, the conversion reactant can contain a fluorine-containing gas or vapor. Thus, a gap filling fluid comprising at least one of $GeF_2$ and $GeF_4$ can be formed.

Suitably, when the convertible layer comprises Sb, the conversion reactant can contain a fluorine-containing gas or vapor. Thus, a gap filling fluid comprising at least one of $SbF_3$ and $SbF_5$ can be formed.

Suitably, when the convertible layer comprises Te, the conversion reactant can contain a bromine-containing gas or vapor. Thus, a gap filling fluid comprising $Te_2Br$ can be formed.

In some embodiments, the convertible layer comprises zinc. For example, the convertible layer can comprise metallic zinc (Zn). The convertible layer can, for example, substantially consist of metallic zinc. Such conversion layers can be suitably exposed to $I_2$ to form $ZnI_2$. $ZnI_2$ has a relatively low melting point of 446° C. Accordingly a $ZnI_2$ layer can be annealed to a temperature above 446° C. to melt that layer. A thusly obtained molten $ZnI_2$ layer can then be allowed to flow into a gap. Alternatively, the Zn-containing convertible layer can be exposed to $I_2$ at a temperature which is higher than the melting point of $ZnI_2$, in which case liquid $ZnI_2$ is formed during exposure, which can then fill the gap, e.g. by flowing under the force of surface tension or otherwise.

In some embodiments, the convertible layer can comprise at least one of metallic zinc (Zn) and zinc oxide (ZnO). The convertible layer can, for example, substantially consist of Zn or ZnO. Such conversion layers can be suitably exposed to $Cl_2$ to form $ZnCl_2$. $ZnCl_2$ has a relatively low melting point of 290° C. Accordingly a $ZnCl_2$ layer can be annealed to a temperature above 290° C. to melt that layer. A thusly obtained molten $Cl_2$ layer can then be allowed to flow into a gap. Alternatively, the Zn or ZnO-containing convertible layer can be exposed to $Cl_2$ at a temperature which is higher than the melting point of $ZnCl_2$, in which case liquid $ZnCl_2$ is formed during exposure, which can then fill the gap, e.g. by flowing under the force of surface tension or otherwise.

In some embodiments, the convertible layer can comprise at least one of metallic zinc (Zn) and zinc oxide (ZnO). The convertible layer can, for example, substantially consist of Zn or ZnO. Such conversion layers can be suitably exposed to $Br_2$ to form $ZnBr_2$. $ZnBr_2$ has a relatively low melting point of 394° C. Accordingly a $ZnBr_2$ layer can be annealed to a temperature above 394° C. to melt that layer. A thusly obtained molten $ZnBr_2$ layer can then be allowed to flow into a gap. Alternatively, the Zn or ZnO-containing convertible layer can be exposed to $Br_2$ at a temperature which is higher than the melting point of $ZnBr_2$, in which case liquid $ZnBr_2$ is formed during exposure, which can then fill the gap, e.g. by flowing under the force of surface tension or otherwise.

In some embodiments, the convertible layer can comprise niobium (Nb), for example metallic niobium or a niobium oxide or nitride. In such embodiments, the conversion reactant can suitably comprise one of chlorine or iodine. Accordingly, a gap filling fluid comprising at least one of $NbCl_4$ and $NbI_5$ can be formed.

In some embodiments, the convertible layer can comprise tantalum (Ta), for example metallic tantalum or a tantalum oxide or nitride. In such embodiments, the conversion reactant can suitably comprise one of fluorine, chlorine, bromine, and iodine. Accordingly, a gap filling fluid comprising at least one of $TaCl_5$, $TaI_5$, $TaF_5$, and $TaBr_5$ can be formed.

In some embodiments, the convertible layer can comprise vanadium (V), for example metallic vanadium or a vanadium oxide or nitride. In such embodiments, the conversion reactant can suitably comprise one of fluorine and bromine. Accordingly, a gap filling fluid comprising at least one of $VOCl_3$, $VF_4$, $VF_5$, $VBr_3$ can be formed.

In some embodiments, the convertible layer can comprise titanium (Ti), for example metallic titanium or a titanium oxide or nitride. In such embodiments, the conversion reactant can suitably comprise fluorine. Accordingly, a gap filling fluid comprising $TiF_4$ can be formed.

In some embodiments, the convertible layer can comprise zirconium (Zr), for example metallic zirconium or a zirconium oxide or nitride. In such embodiments, the conversion reactant can suitably comprise one of chlorine, bromine, and iodine. Accordingly, a gap filling fluid comprising at least one of $ZrI_4$, $ZrCl_4$, and $ZrBr_4$ can be formed.

In some embodiments, the convertible layer can comprise hafnium (Hf), for example metallic hafnium or a hafnium oxide or nitride. In such embodiments, the conversion reactant can suitably comprise one of chlorine and iodine. Accordingly, a gap filling fluid comprising at least one of $HfCl_4$ and $HfI_4$ can be formed.

In some embodiments, the convertible layer can comprise rhodium (Rh), for example metallic rhodium or rhodium oxide or nitride. In such embodiments, the conversion reactant can suitably comprise bromine. Accordingly, a gap filling fluid comprising $RhBr_3$ can be formed.

In some embodiments, the convertible layer can comprise iron (Fe), for example metallic iron or iron oxide or nitride. In such embodiments, the conversion reactant can suitably comprise bromine. Accordingly, a gap filling fluid comprising at least one of $FeBr_3$ and $FeBr_2$ can be formed.

In some embodiments, the convertible layer can comprise chromium (Cr), for example metallic chromium or chromium oxide or nitride. In such embodiments, the conversion reactant can suitably comprise fluorine. Accordingly, a gap filling fluid comprising $CrF_5$ can be formed.

In some embodiments, the convertible layer can comprise molybdenum (Mo), for example molybdenum or molybdenum oxide or nitride. In such embodiments, the conversion reactant can suitably comprise chlorine, bromine, or iodine. Accordingly, a gap filling fluid comprising at least one of $Mo_6Cl_{12}$, $MoCl_4$, $MoI_3$, and $MoBr_3$ can be formed.

In some embodiments, the convertible layer comprises gold (Au), for example metallic gold or an inorganic gold compound. In such embodiments, the conversion reactant can suitably comprise fluorine or bromine. Accordingly, a gap filling fluid comprising at least one of $AuF_3$ and $AuBr$ can be formed.

In some embodiments, the convertible layer comprises silver (Ag), for example metallic silver or an inorganic silver compound. In such embodiments, the conversion reactant can suitably comprise fluorine. Accordingly, a gap filling fluid comprising $AgF_3$ can be formed.

In some embodiments, the convertible layer comprises platinum (Pt), for example metallic platinum or an inorganic platinum compound. In such embodiments, the conversion reactant can suitably comprise bromine. Accordingly, a gap filling fluid comprising $PtBr_4$ can be formed.

In some embodiments, the convertible layer comprises nickel (Ni), for example metallic nickel or an inorganic nickel compound. In such embodiments, the conversion reactant can suitably comprise bromine. Accordingly, a gap filling fluid comprising $NiBr_2$ can be formed.

In some embodiments, the convertible layer comprises copper (Cu), for example metallic copper or an inorganic copper compound. In such embodiments, the conversion reactant can suitably comprise bromine. Accordingly, a gap filling fluid comprising $CuBr_2$ can be formed.

In some embodiments, the convertible layer comprises cobalt (Co), for example metallic cobalt or an inorganic cobalt compound. In such embodiments, the conversion reactant can suitably comprise iodine. Accordingly, a gap filling fluid comprising CoI can be formed.

In some embodiments, the convertible layer comprises zinc (Zn), for example metallic Zn or an inorganic Zn compound. In such embodiments, the conversion reactant can suitably comprise at least one of chlorine and iodine. Accordingly, a gap filling fluid comprising at least one of ZnC12 and ZnI2 can be formed.

In some embodiments, the convertible layer can comprise aluminum (Al), for example metallic aluminum or an inorganic aluminum compound such as aluminum oxide or nitride. In such embodiments, the conversion reactant can suitably comprise chlorine or iodine. Accordingly, a gap filling fluid comprising at least one of $AlCl_3$ and $AlI_3$ can be formed.

In some embodiments, the convertible layer can comprise indium (In), for example metallic indium or an inorganic indium compound such as indium oxide or nitride. In such embodiments, the conversion reactant can suitably comprise bromine. Accordingly, a gap filling fluid comprising $InBr_3$ can be formed.

In some embodiments, the convertible layer can comprise tin (Sn), for example metallic tin or an inorganic tin compound such as tin oxide or nitride. In such embodiments, the conversion reactant can suitably comprise at least one of chlorine and bromine. Accordingly, a gap filling fluid comprising at least one of $SnCl_2$ and $SnBr_2$ can be formed.

In some embodiments, the convertible layer can comprise bismuth (Bi), for example metallic bismuth or an inorganic bismuth compound such as bismuth oxide or nitride. In such embodiments, the conversion reactant can suitably comprise fluorine. Accordingly, a gap filling fluid comprising $BiF_5$ can be formed.

In some cases, it can be desirable to alter a material that is formed by a method as described herein into a different form. Thus, in some embodiments, a method as described herein further comprises a transformation treatment. A suitable transformation treatment includes one or more of a thermal anneal, exposing the substrate to a reactant, exposing the substrate to a direct plasma, and exposing the substrate to active species such as ions or radicals that are generated in a remote plasma.

In other words, a gap filling fluid, in a liquid or solid state, can be subjected to a transformation treatment to form a solid transformed material. Suitable transformation treatments include exposure to a direct or remote plasma, and exposure to a thermal transformation reagents. Suitable plasmas include remote and direct hydrogen plasmas, oxygen plasmas, and nitrogen plasmas. Suitable thermal transformation reagents include gasses and vapors containing at least one of hydrogen, oxygen, and nitrogen. Thus, a gap can be suitably filled with a transformed material of choice. The transformed material can comprise, for example, at least one of a metal, a nitride, and an oxide.

In some embodiments, the transformation treatment includes exposing the substrate to a direct plasma, such as a direct nitrogen plasma or a direct oxygen plasma. Suitable nitrogen plasmas employ a plasma gas comprising a nitrogen containing gas or vapor such as $N_2$ and $NH_3$. Suitable oxygen plasmas employ a plasma gas comprising an oxygen containing gas or vapor such as $O_2$ and $H_2O$.

In some embodiments, the transformation treatment includes a thermal process, such as a thermal process that comprises exposing the substrate to an oxygen reactant.

In some embodiments, transforming the gap filling fluid comprises exposing the substrate to a reduction step and to an oxidation step. In some embodiments, the reduction step precedes the oxidation step. Alternatively, the oxidation step can precede the reduction step. In some embodiments, the reduction step comprises exposing the substrate to a hydrogen plasma. In some embodiments, the oxidation step comprises exposing the substrate to an oxygen plasma.

In some embodiments, transforming the gap filling fluid comprises exposing the gap filling fluid or the converted material to a reduction step and to a nitridation step. It shall be understood that a nitridation step refers to a step of converting a material into a nitride. In some embodiments, the reduction step precedes the nitridation step. Alternatively, the nitridation step can precede the reduction step. In some embodiments, the reduction step comprises exposing the substrate to a hydrogen plasma. In some embodiments, the nitridation step comprises exposing the substrate to a nitrogen plasma. Suitable nitrogen plasmas include plasmas in which the plasma gas comprises at least one of $N_2$, $NH_3$, and mixtures comprising $N_2$ and $H_2$.

The transformation treatment can, in some embodiments, be carried out once after the gap has been filled, or it can be carried out multiple times, i.e. gap filling steps and transformation steps can be carried out alternatingly and cyclically in order to fill a gap with a transformed material. Thus, in some embodiments, a method as described herein can comprise executing a plurality of super cycles. A super cycle comprises, in the following order: forming the convertible layer on the substrate; exposing the substrate to the conversion reactant; and, subjecting the substrate to the transformation treatment. In some cases, carrying out a cyclical transformation treatment can result in a transformed layer having advantageous properties, such as higher etch resistance and/or less stress.

Thus, in some embodiments, a method as described herein comprises a plurality of super cycles. For example, a method as described herein can comprise from at least 2 to at most 5, or from at least 5 to at most 10, or from at least 10 to at most 20, or from at least 20 to at most 50, or from at least 50 to at most 100 super cycles. A super cycle comprises forming a convertible layer on the substrate; exposing the substrate to a conversion reactant; and transforming the gap filling fluid into a transformed material.

The total number of super cycles comprised in a method as described herein depends, inter alia, on the total layer thickness that is desired. In some embodiments, the method comprises from at least 1 super cycle to at most 100 super cycles, or from at least 2 super cycles to at most 80 super cycles, or from at least 3 super cycles to at most 70 super cycles, or from at least 4 super cycles to at most 60 super cycles, or from at least 5 super cycles to at most 50 super cycles, or from at least 10 super cycles to at most 40 super cycles, or from at least 20 super cycles to at most 30 super cycles. In some embodiments, the method comprises at most 100 super cycles, or at most 90 super cycles, or at most 80 super cycles, or at most 70 super cycles, or at most 60 super cycles, or at most 50 super cycles, or at most 40 super cycles, or at most 30 super cycles, or at most 20 super cycles, or at most 10 super cycles, or at most 5 super cycles, or at most 4 super cycles, or at most 3 super cycles, or at most 2 super cycles, or a single super cycle.

Further described herein is a system that comprises a reaction chamber, a precursor gas source, a deposition reactant gas source, and a controller. The precursor gas source comprises a metal precursor, the deposition reactant gas source comprises a deposition reactant. The controller is configured to control gas flow into the reaction chamber to form a layer on a substrate by means of a method as described herein.

Optionally, the system further comprises one or more of an active species source and a transformation reactant source. The active species source is, if present, arranged for providing an active species. The transformation reactant source is, if present, arranged for providing a conversion reactant.

In some embodiments, the system comprises two distinct, i.e. separate, reaction chambers: a first reaction chamber and a second reaction chamber. The first reaction chamber is configured for forming a convertible layer on a substrate. The second reaction chamber is configured for exposing the substrate to an active species, for converting a gap filling fluid or a solidified material into a converted material, or both. In some embodiments, the first reaction chamber is maintained at a first reaction chamber temperature, and the second reaction chamber is maintained at a second reaction chamber temperature. In some embodiments, the first reaction chamber temperature is lower than the second reaction chamber temperature, for example from at least 10° C. lower to at most 100° C. lower. In some embodiments, the first reaction chamber temperature is higher than the second reaction chamber temperature, for example from at least 10° C. higher to at most 100° C. higher. In some embodiments, the first reaction chamber temperature is equal to the second reaction chamber temperature, e.g. within a margin of 10° C., 20° C., 30° C., or 40° C.

In accordance with yet additional embodiments of the disclosure, a device or portion thereof can be formed using a method and/or a structure as described herein. The device can include a substrate, one or more insulating layers, one or more metallic layers, and one or more semiconducting layers. The device further comprises a gap filled according to a method as disclosed herein.

Further described is a field effect transistor comprising a gate contact comprising a layer formed according to a method as described herein.

Further described is a metal contact comprising a layer deposited by means of a method as described herein.

Further provided herein is a metal-insulator-metal (MIM) capacitor comprising a metal electrode comprising a layer formed by means of a method as described herein.

FIG. 1 shows a schematic representation of an embodiment of a method as described herein. The method can be used to fill a gap, for example, in order to form an electrode in a semiconductor device. However, unless otherwise noted, the presently described methods are not limited to such applications. The method comprises a step (111) of positioning a substrate on a substrate support. The substrate support is positioned in a reaction chamber. Suitable substrate supports include pedestals, susceptors, and the like. The method further comprises forming a convertible layer on the substrate (112). Optionally, the reaction chamber is then purged. Then, the method comprises exposing the substrate to a conversion reactant (113). Accordingly, a gap filling fluid is formed in the gap. Optionally, the step of forming a convertible layer on the substrate (112) and the step of exposing the substrate to a conversion reactant (113) are repeated (115) one or more times. When a sufficient amount of gap filling fluid has been formed in the gap, the method ends (114).

Optionally, a purge is carried out after forming a convertible layer on the substrate (112) by means of a post-deposition purge. Optionally, a purge is carried out after exposing the substrate to a conversion reactant (113). Purging can be done by exposing the substrate to a purge gas that, in turn, can be done, for example, by providing a purge gas to the reaction chamber. Exemplary purge gasses include noble gasses. Exemplary noble gasses include He, Ne, Ar, Xe, and Kr. Alternatively, the purging can comprise transporting the substrate through a purge gas curtain. During a purge, surplus chemicals and reaction byproducts, if any, can be removed from the substrate surface or reaction chamber, such as by purging the reaction space or by moving the substrate, before the substrate is subjected to a next step.

Figure 2:
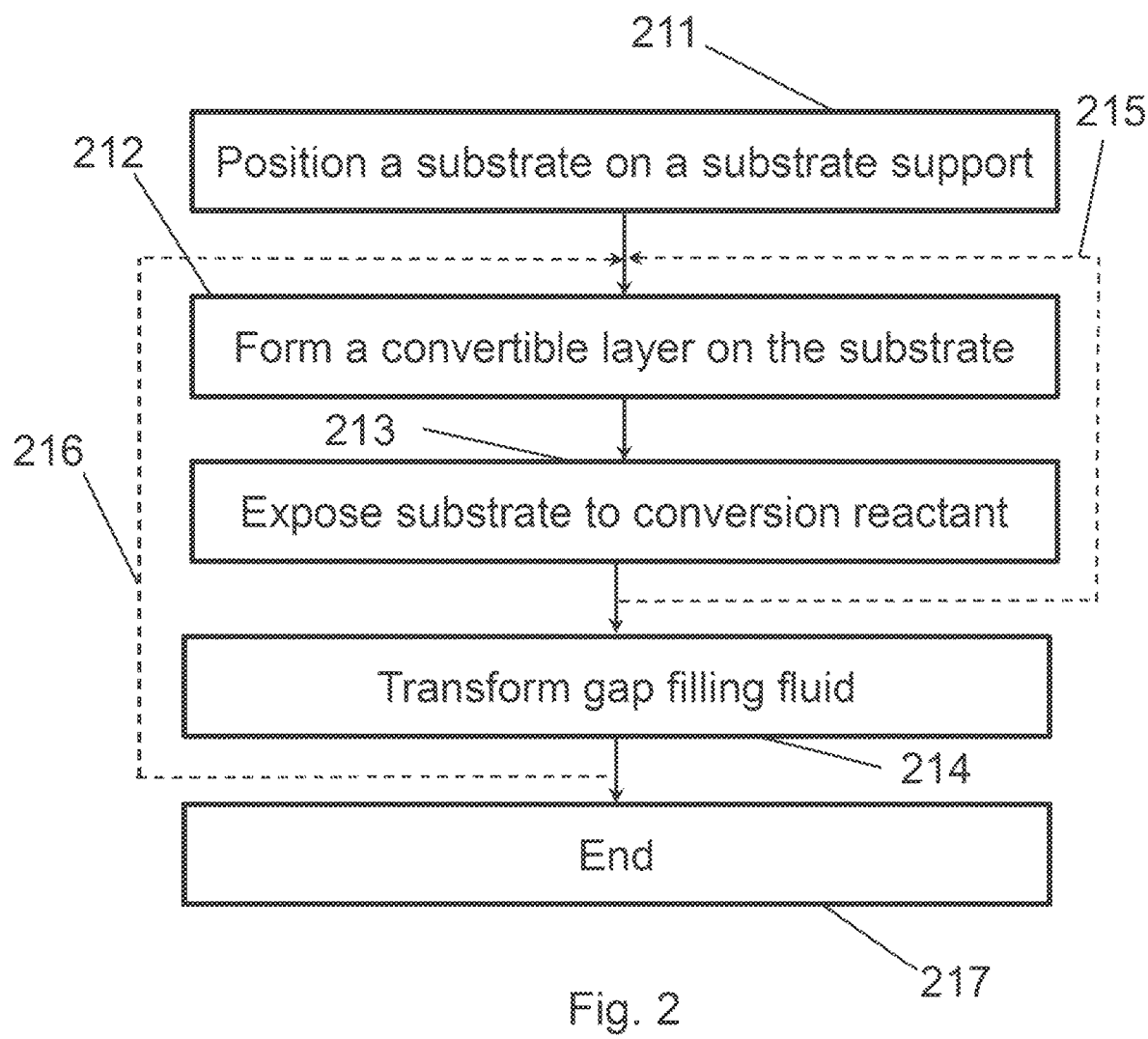
FIG. 2 illustrates an embodiment of a method as disclosed herein.

FIG. 2 schematically shows another embodiment of a method as described herein. The method of FIG. 2 is similar to that of FIG. 1 in the sense that it also comprises positioning a substrate on a substrate support (211), forming a convertible layer on the substrate (212), and exposing the substrate to a conversion reactant (213). As before, the steps of forming a convertible layer on the substrate (212) and converting the convertible layer to form a gap filling fluid (213) can be repeated (215) one or more times.

The method of FIG. 2 differs from the method of FIG. 1 in that it further comprises a step of transforming the gap filling fluid (214) to form a transformed material. Optionally, a purge is carried out after the step of transforming the gap filling fluid (214). The step of transforming the gap filling fluid (214) can comprise, for example, exposing the substrate to a direct plasma such as a direct oxygen plasma or a direct nitrogen plasma. Optionally, the method of FIG. 2 comprises a plurality of super cycles (216) in which the steps from forming a convertible layer on the substrate (212) to transforming the gap filling fluid (214) are repeated one or more times. After a pre-determined amount of converted material has been formed on the substrate, the method of FIG. 2 ends (217).

Figure 3:
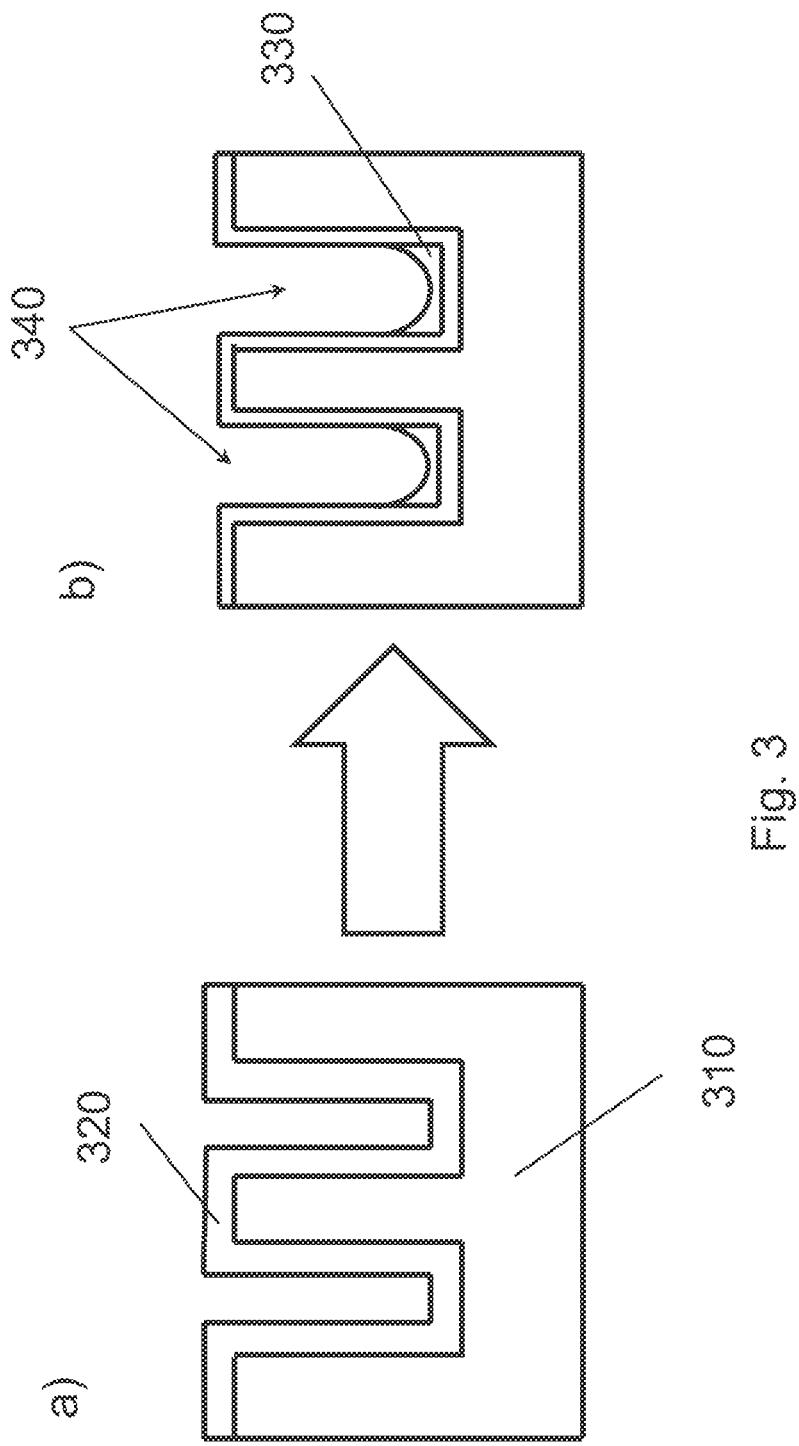
FIG. 3 illustrates the operation of an embodiment of a method as described herein.

FIG. 3 illustrates the operation of a method as described herein. In particular, FIG. 3 shows a substrate (310) comprising a plurality of gaps (340). Panel a) shows a convertible layer (320) that is conformally deposited on the substrate (310). Panel b) shows the same substrate (310) after it has been exposed to a conversion reactant. The conversion reactant exposure can turn at least a part of the convertible layer (320) into a gap filling fluid that flows into the gap. Optionally, the gap filling fluid can then be solidified to form a solidified material (330). Optionally, the solidified material (330) or gap filling fluid can be converted into a converted material, as described elsewhere herein.

Figure 4:
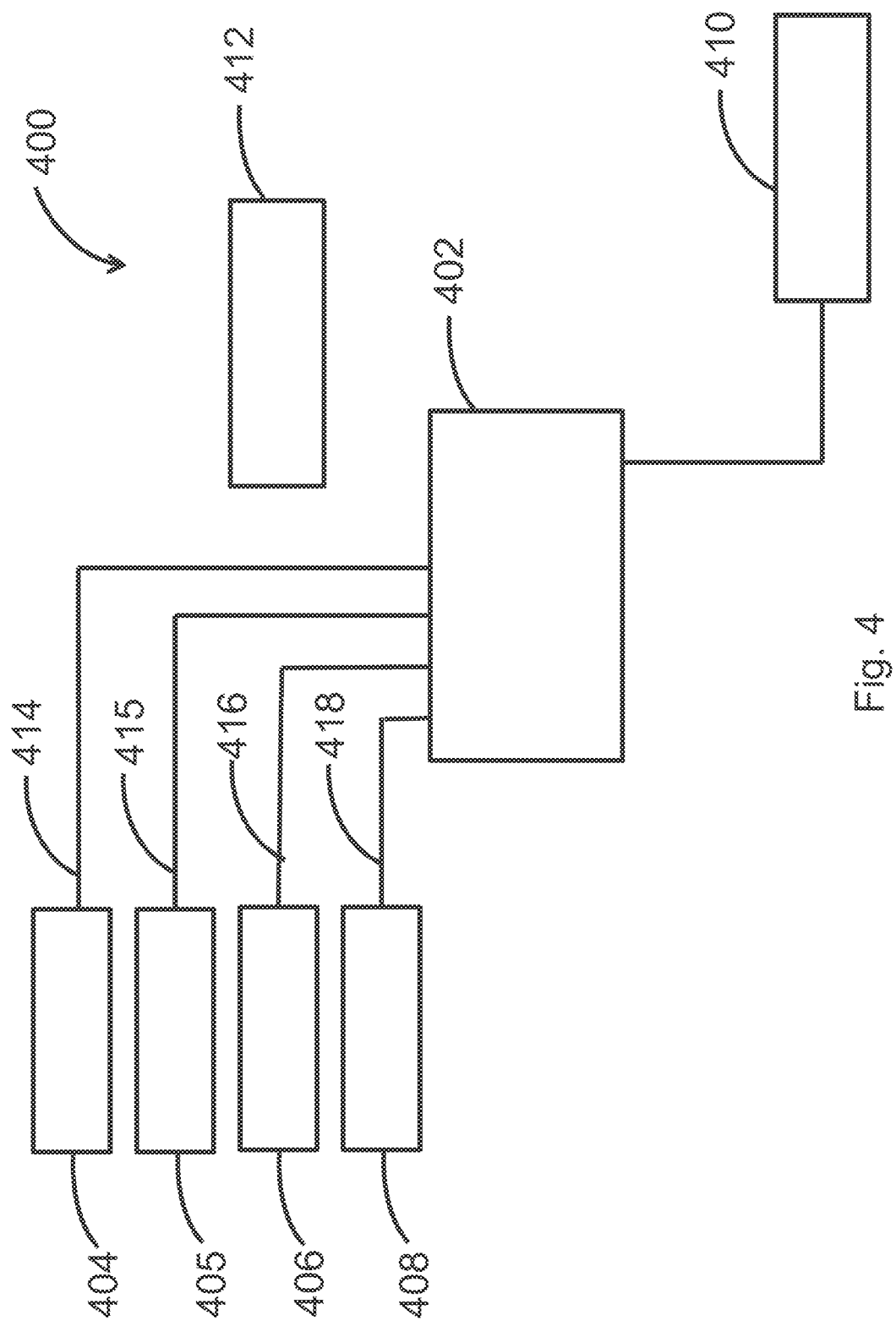
FIG. 4 illustrates an embodiment of a system (400) in accordance with yet additional exemplary embodiments of the disclosure.

FIG. 4 illustrates a system (400) in accordance with yet additional exemplary embodiments of the disclosure. The system (400) can be used to perform a method as described herein and/or form a structure or device portion, e.g. in an integrated circuit, as described herein.

In the illustrated example, the system (400) includes one or more reaction chambers (402), a precursor gas source (404), a reactant gas source (406), a purge gas source (408), an exhaust (410), and a controller (412).

The reaction chamber (402) can include any suitable reaction chamber, such as an ALD or CVD reaction chamber. In some embodiments, the reaction chamber comprises a showerhead injector and a substrate support (not shown).

The precursor gas source (404) can include a vessel and one or more precursors as described herein—alone or mixed with one or more carrier (e.g., noble) gases. The reactant gas source (406) can include a vessel and one or more reactants as described herein—alone or mixed with one or more carrier gases. The purge gas source (408) can include one or more inert gases as described herein. Although illustrated with four gas sources (404-408), the system (400) can include any suitable number of gas sources. The gas sources (404-408) can be coupled to reaction chamber (402) via lines (414-418), which can each include flow controllers, valves, heaters, and the like. The exhaust (410) can include one or more vacuum pumps.

The controller (412) includes electronic circuitry and software to selectively operate valves, manifolds, heaters, pumps and other components included in the system (400). Such circuitry and components operate to introduce precursors, reactants, and purge gases from the respective sources (404-408). The controller (412) can control timing of gas pulse sequences, temperature of the substrate and/or reaction chamber, pressure within the reaction chamber, and various other operations to provide proper operation of the system (400). The controller (412) can include control software to electrically or pneumatically control valves to control flow of precursors, reactants and purge gases into and out of the reaction chamber (402). The controller (412) can include modules such as a software or hardware component, e.g., a FPGA or ASIC, which performs certain tasks. A module can advantageously be configured to reside on the addressable storage medium of the control system and be configured to execute one or more processes.

Other configurations of the system (400) are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into the reaction chamber (402). Further, as a schematic representation of a system, many components have been omitted for simplicity of illustration, and such components may include, for example, various valves, manifolds, purifiers, heaters, containers, vents, and/or bypasses.

During operation of the system (400), substrates, such as semiconductor wafers (not illustrated), are transferred from, e.g., a substrate handling system to reaction chamber (402). Once such substrate(s) are transferred to reaction chamber (402), one or more gases from the gas sources (404-408), such as precursors, reactants, carrier gases, and/or purge gases, are introduced into the reaction chamber (402).

Figure 5:
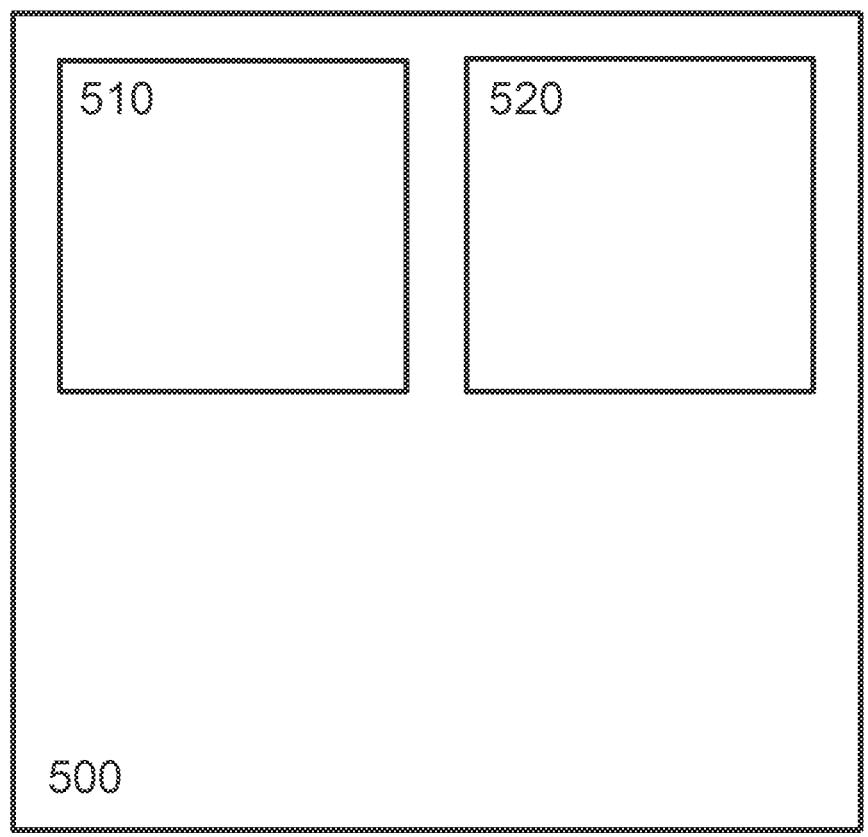
FIG. 5 shows another embodiment of a system (500) as described herein in a stylized way.

FIG. 5 shows another embodiment of a system (500) as described herein in a stylized way. The system (500) of FIG. 5 is similar to that of FIG. 4. It comprises two distinct reaction chambers: a first reaction chamber (510) and a second reaction chamber (520). The first reaction chamber (510) is arranged for forming a convertible layer. The second reaction chamber (520) is arranged for at least one of exposing the substrate to conversion reagent and transforming a gap filling fluid into a transformed material.

Figure 6:
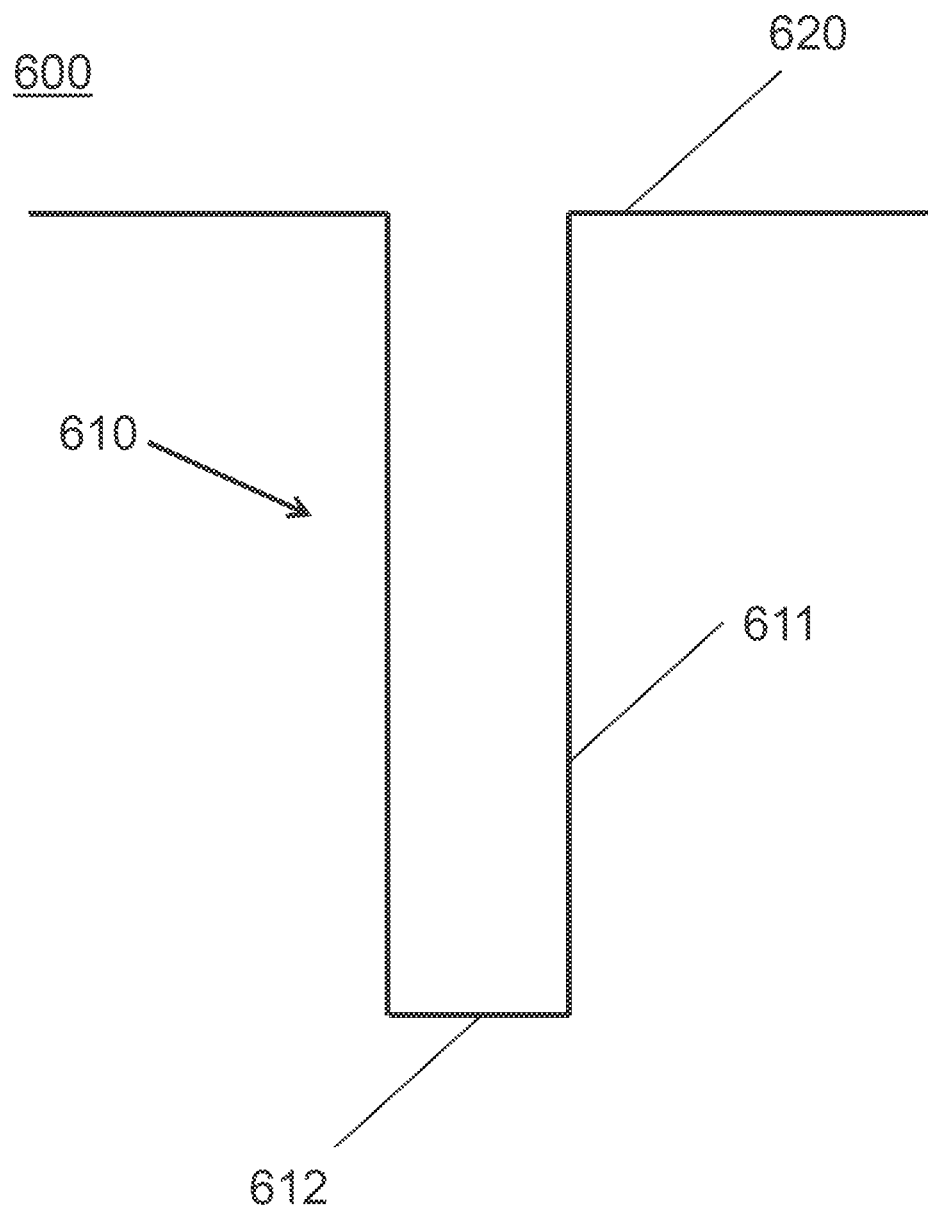
FIG. 6 shows a stylized representation of a substrate (600) comprising a gap (610).

FIG. 6 shows a schematic representation of a substrate (600) comprising a gap (610). The gap (610) comprises a sidewall (611) and a distal end (612). The substrate further comprises a proximal surface (620). In some embodiments, the sidewall (611), the distal end (612) comprise the same material. In some embodiments, at least one of the sidewall (611) and the distal end comprise a dielectric, such as a silicon containing dielectric such as silicon oxide, silicon nitride, silicon carbide, and mixtures thereof. In some embodiments, at least one of the sidewall (611) and the distal end (612) comprise a metal such as a transition metal, a post transition metal, and a rare earth metal. In some embodiments, the metal comprises Cu, Co, W, Ru, Mo, Al, or an alloy thereof. In some embodiments, at least one of the sidewall (611) and the distal end (612)

In some embodiments, the sidewall (611) and the distal end (612) have an identical, or a substantially identical, composition. In some embodiments, the sidewall (611) and the distal end (612) have a different composition. In some embodiments, the sidewall and the distal end (612) comprise a dielectric. In some embodiments, the sidewall (611) and the distal end (612) comprise a metal. In some embodiments, the sidewall (611) comprises a metal and the distal end (612) comprises a dielectric. In some embodiments, the sidewall (611) comprises a dielectric and the distal end comprises a metal.

In some embodiments, the proximal surface (620) has the same composition as the sidewall (611). In some embodiments, the proximal surface (620) has a different composition than the sidewall (611). In some embodiments, the proximal surface (620) has a different composition than the distal end (612). In some embodiments, the proximal surface (620) has the same composition as the distal end (612).

In some embodiments, the proximal surface (620), the sidewall (611), and the distal end (612) comprise the same material. In some embodiments, the proximal surface (620), the sidewall (611), and the distal end (612) comprise a dielectric. In some embodiments, the proximal surface (620), the sidewall (611), and the distal end (612) comprise a metal. In some embodiments, the proximal surface (620), the sidewall (611), and the distal end (612) comprise a semiconductor.

The invention claimed is:

1. A method of filling a gap, the method comprising
providing a substrate to a reaction chamber, the substrate comprising the gap;
forming a convertible layer on the substrate; and,
exposing the substrate to a conversion reactant, thereby thermally converting at least a part of the convertible layer into a gap filling fluid;
wherein the gap filling fluid at least partially fills the gap.

2. The method according to claim 1 wherein the convertible layer comprises at least one of a metal, a metal oxide, a metal nitride, and a metal carbide.

3. The method according to claim 1 wherein the convertible layer is at least partially metallic or semiconducting.

4. The method according to claim 1, wherein the convertible layer comprises an element selected from W, Ge, Sb, Te, Nb, Ta, V, Ti, Zr, Rh, Fe, Cr, Mo, Au, Pt, Ag, Ni, Cu, Co, Zn, Al, In, Sn, and Bi.

5. The method according to claim 1, wherein the conversion reactant comprises a halogen.

6. The method according to claim 5 wherein the conversion reactant comprises an elemental halogen.

7. The method according to claim 5 wherein the conversion reactant comprises a hydrogen halide.

8. The method according to claim 5 wherein the conversion reactant comprises a bond selected from a C—Cl bond, a P—Cl bond, a N—Cl bond, and a S—Cl bond.

9. The method according to claim 1, wherein the conversion reactant comprises a compound having a chemical formula selected from formula i and ii;

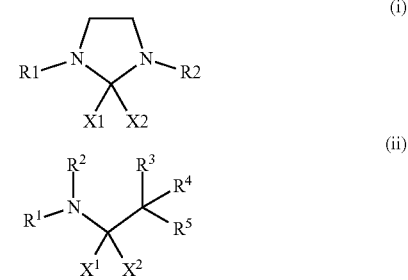

wherein R1, R2, R3, R4, and R5 are independently selected from H and hydrocarbyl; and,
wherein X, $X^1$, and $X^2$ are independently selected from F, Cl, Br, and I.

10. The method according to claim 1, wherein the conversion reactant comprises a compound that has a structure according to any one of formulas i, ii, iii, or iv

-continued

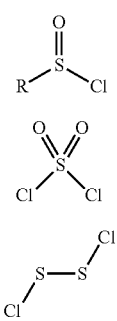

wherein R is a hydrocarbyl.

11. The method according to claim 1, wherein the conversion reactant comprises a compound having a structure according to any one of formulas i, ii, iii, iv, or v;

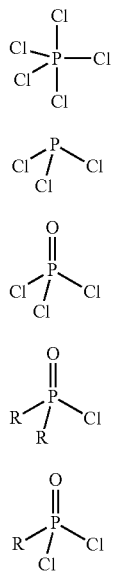

wherein R is a hydrocarbyl.

12. The method according to claim 1, wherein the conversion reactant comprises an acyl chloride.

13. The method according to claim 12 wherein the acyl chloride comprises a compound having a structure according to formula i or ii;

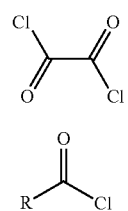

wherein R is a hydrocarbyl.

14. The method according to claim 1, wherein the conversion reactant comprises a compound having a structure according to the formula

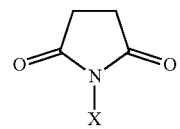

wherein X is a halogen.

15. The method according to claim 1, wherein the conversion reactant comprises a compound having a structure according to the formula:

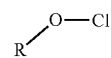

wherein R is a hydrocarbyl.

16. The method according to claim 1, further comprising subjecting the substrate to a transformation treatment.

17. The method according to claim 16 comprising executing a plurality of super cycles, a super cycle comprising, in the following order:
forming the convertible layer on the substrate;
exposing the substrate to the conversion reactant; and,
subjecting the substrate to the transformation treatment.

18. The method according to claim 16, wherein the transformation treatment comprises exposing the substrate to a plasma.

19. The method according to claim 16, wherein the transformation treatment comprises exposing the substrate to at least one of radicals and ions.

* * * * *